United States Patent
Daghighian et al.

(10) Patent No.: US 10,111,343 B2
(45) Date of Patent: Oct. 23, 2018

(54) METHOD OF FORMING MICRO VIA IN PRINTED CIRCUIT BOARD

(71) Applicant: FINISAR CORPORATION, Sunnyvale, CA (US)

(72) Inventors: Henry Meyer Daghighian, Menlo Park, CA (US); Steven C. Bird, San Jose, CA (US); YongShan Zhang, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 428 days.

(21) Appl. No.: 14/538,684

(22) Filed: Nov. 11, 2014

(65) Prior Publication Data

US 2015/0136468 A1    May 21, 2015

Related U.S. Application Data

(60) Provisional application No. 61/906,404, filed on Nov. 19, 2013.

(51) Int. Cl.

| H01K 3/10 | (2006.01) |
|---|---|
| H05K 3/40 | (2006.01) |
| H05K 3/00 | (2006.01) |
| H05K 1/02 | (2006.01) |

(52) U.S. Cl.
CPC ......... *H05K 3/4046* (2013.01); *H05K 1/0245* (2013.01); *H05K 1/0251* (2013.01); *H05K 3/0094* (2013.01); *H05K 2201/0959* (2013.01); *H05K 2201/09636* (2013.01); *H05K 2201/10242* (2013.01); *Y10T 29/49165* (2015.01)

(58) Field of Classification Search
CPC .................. H05K 1/115; H05K 3/429; H05K 2201/09809; H05K 3/0047; H05K 2201/096; H05K 3/4038; Y10T 29/49155; Y10T 29/49165; Y10T 29/49124; Y10T 29/49117; H01L 21/486; H01L 2224/11; H01L 2225/06541; F21Y 2115/10; F21Y 2107/00
USPC ......... 29/852, 834, 837, 840, 843, 846, 847, 29/849, 851, 853
See application file for complete search history.

(56) References Cited

U.S. PATENT DOCUMENTS

| 5,909,011 A * | 6/1999 | Chartrand ............. H05K 1/114 174/261 |
|---|---|---|
| 6,717,071 B2 * | 4/2004 | Chang ............... H01L 23/49827 174/261 |
| 7,682,962 B2 * | 3/2010 | Hembree ............. B23K 20/004 228/4.5 |

\* cited by examiner

*Primary Examiner* — Thiem Phan
(74) *Attorney, Agent, or Firm* — Maschoff Brennan

(57) ABSTRACT

Some embodiments relate to micro vias in printed circuit boards (PCBs). In an example, a PCB may include a PCB substrate and a micro via. The micro via may extend between opposing surfaces of the PCB substrate and may have a diameter less than or equal to about 100 microns. In another example, a method of forming micro vias in a PCB may include forming a through hole in a PCB substrate of the PCB. The method may also include positioning a pillar that is electrically conductive within the through hole. The method may also include backfilling the through hole around the pillar with an epoxy backfill.

23 Claims, 22 Drawing Sheets

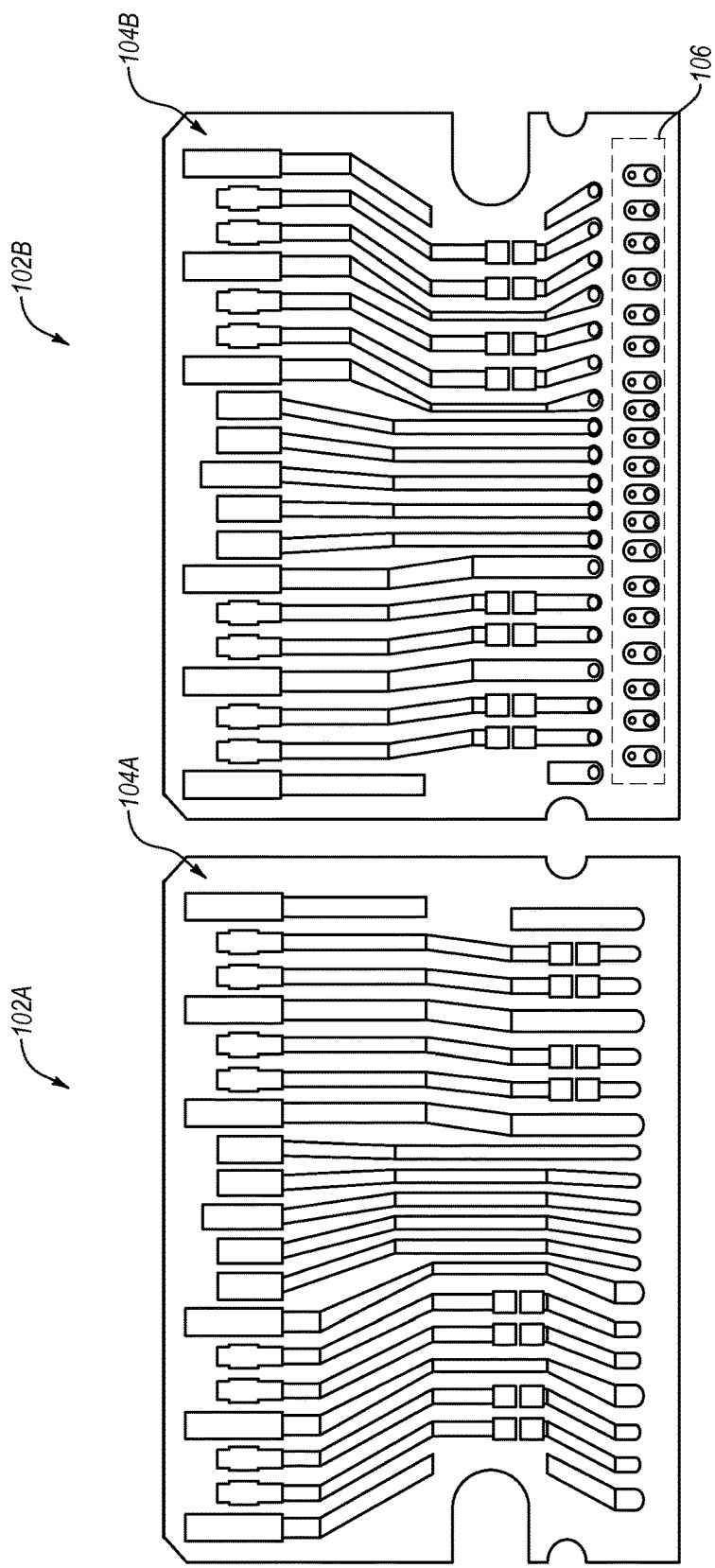

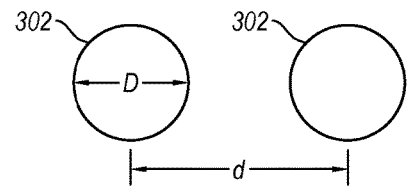

$$304 \quad L = \frac{\mu_0 \mu_r}{\pi} \ln\left[\frac{d}{D} + \sqrt{\left(\frac{d}{D}\right)^2 - 1}\right] H$$

$$306 \quad C = \frac{\pi \varepsilon_0 \varepsilon_r}{\ln\left[\frac{d}{D} + \sqrt{\left(\frac{d}{D}\right)^2 - 1}\right]} H$$

$$308 \quad M = 0.002 H \left[\ln\left(\frac{H}{d} + \sqrt{1 + \frac{H^2}{d^2}}\right) - \sqrt{1 + \frac{d^2}{H^2}} + \frac{d}{H}\right] \times 10^{-4}$$

$$310 \quad Z_0 = \sqrt{\frac{\frac{\mu_0 \mu_r}{\pi} \ln\left[\frac{d}{D} + \sqrt{\left(\frac{d}{D}\right)^2 - 1}\right] H}{\frac{\pi \varepsilon_0 \varepsilon_r}{\ln\left[\frac{d}{D} + \sqrt{\left(\frac{d}{D}\right)^2 - 1}\right]} H}}$$

$$= 119.9 \ln\left[\frac{d}{D} + \sqrt{\left(\frac{d}{D}\right)^2 - 1}\right]$$

*Fig. 3*

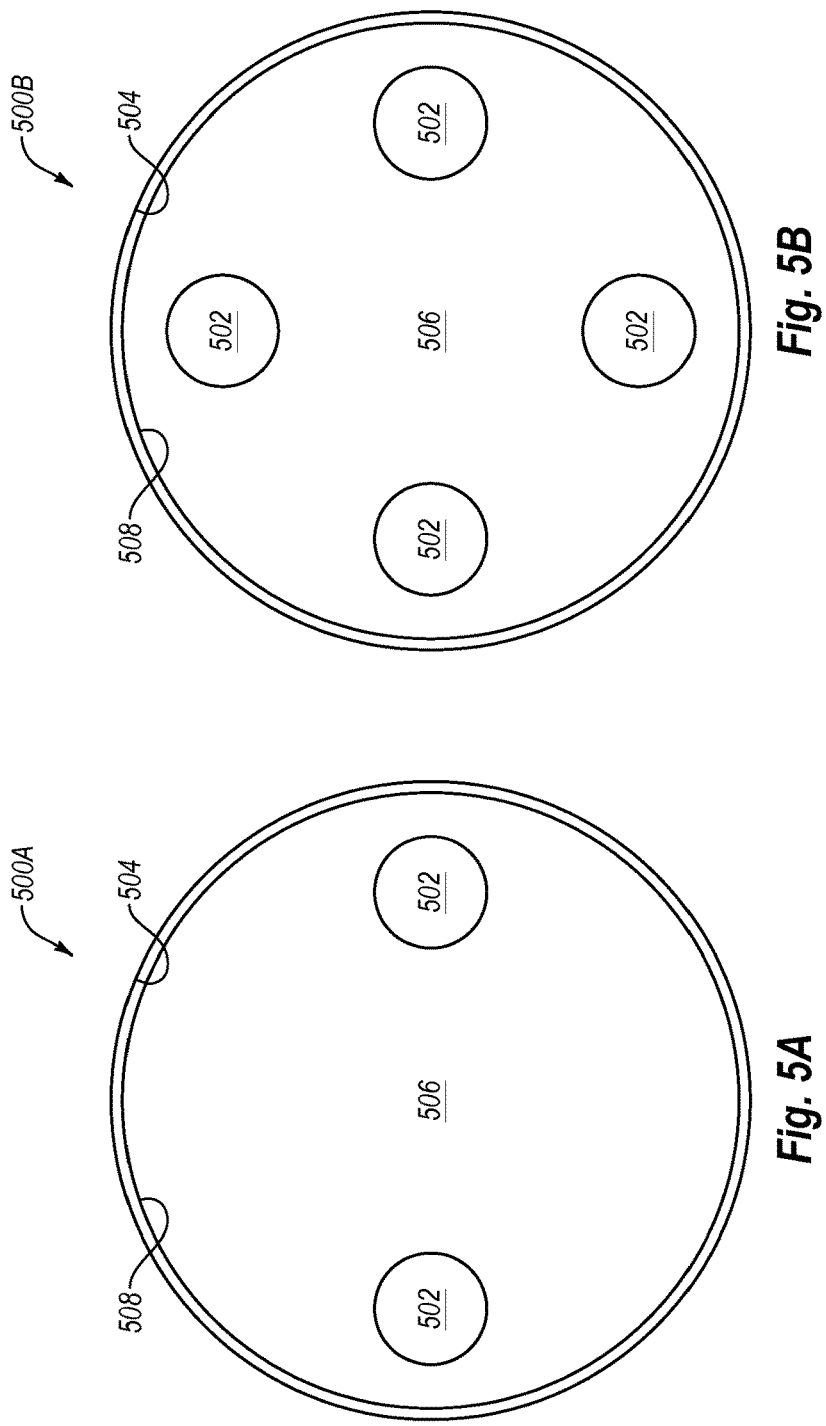

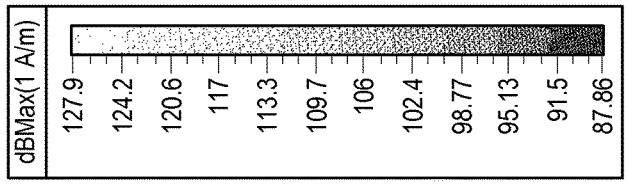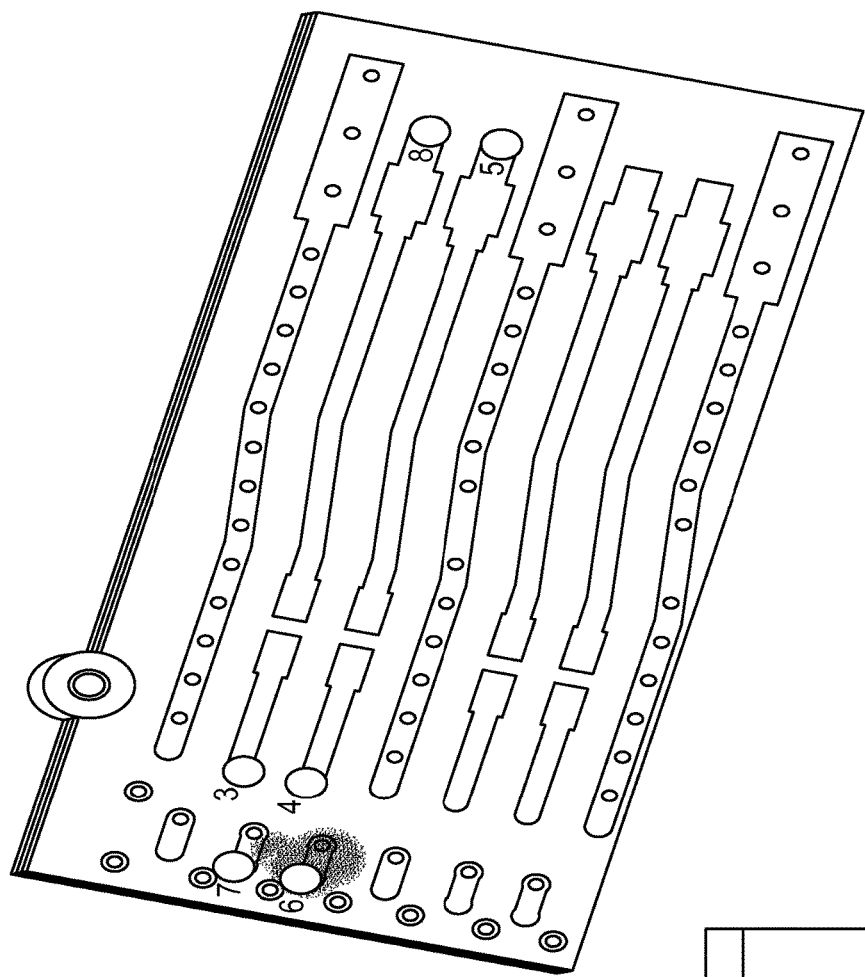
Fig. 7B

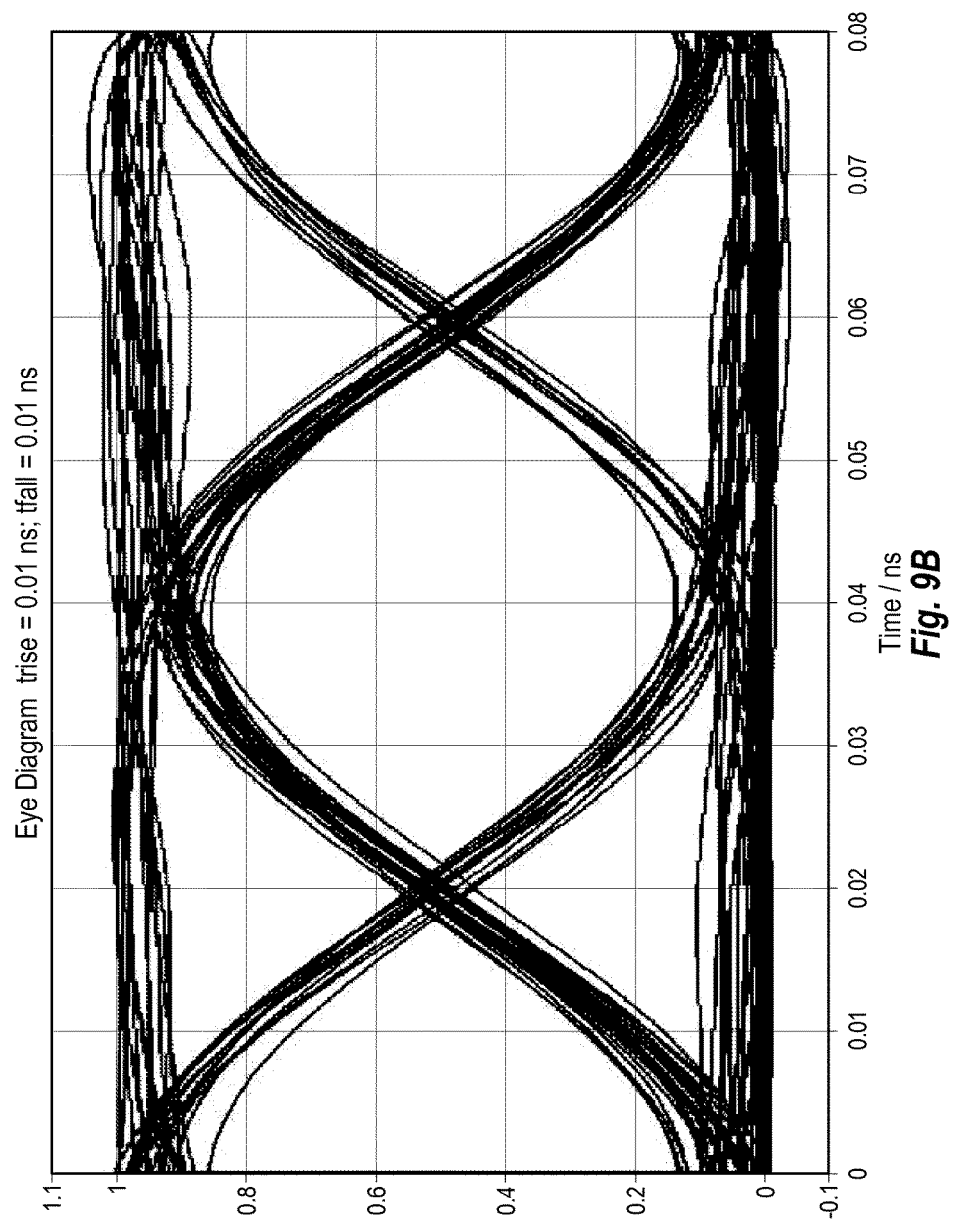

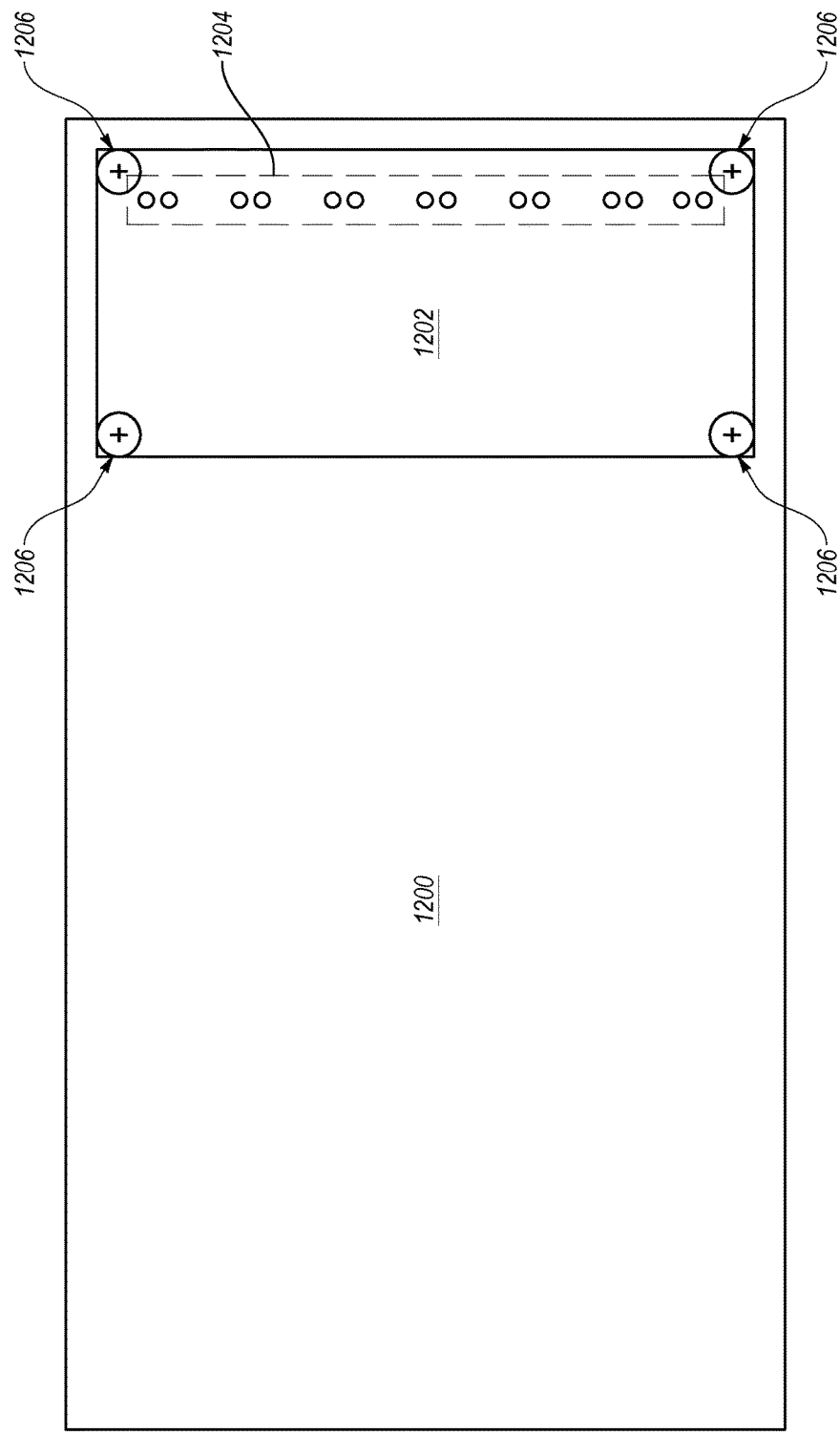

METHOD OF FORMING MICRO VIA IN PRINTED CIRCUIT BOARD

CROSS-REFERENCE TO RELATED APPLICATIONS

This patent application claims the benefit of and priority to U.S. Provisional Patent Application Ser. No. 61/906,404, filed Nov. 19, 2013, which is incorporated herein by reference.

FIELD

The embodiments discussed herein are related to micro vias in printed circuit boards (PCBs).

BACKGROUND

Unless otherwise indicated herein, the materials described herein are not prior art to the claims in the present application and are not admitted to be prior art by inclusion in this section.

Dual-sided high-speed connector designs used for PCBs, such as dual-sided high-speed connector designs used for PCBs in CXP and QSFP form-factor modules, may suffer severe to moderate bandwidth degradation without the use of specialized materials such as low temperature co-fired ceramic (LTCC). Signal transmission in such designs may be degraded due to parasitics associated with stacked or through hole vias, which may limit signal transmission to data rates of about 14 gigabits per second (G) or less.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to micro vias in PCBs.

In an example embodiment, a method of forming micro vias in a printed circuit board (PCB) includes forming a through hole in a PCB substrate of the PCB. The method also includes positioning a pillar that is electrically conductive within the through hole. The method also includes backfilling the through hole around the pillar with an epoxy backfill.

In another example embodiment, a PCB includes a PCB substrate and a micro via. The micro via extends between opposing surfaces of the PCB substrate and has a diameter less than or equal to about 100 microns.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1B illustrates a bottom side of the dual-sided edge connector of FIG. 1A;

FIG. 1C illustrates a top side of the dual-sided edge connector of FIG. 1A;

FIG. 3 depicts two pillars that may be included as vias in a PCB and various parameters that may be associated therewith and various equations for determining other parameters of the two pillars;

FIGS. 5A and 5B illustrate multi-axial vias;

FIG. 7B illustrates simulated h-field generated by exciting a port within a PCB such as the PCB of FIG. 2;

FIG. 9B illustrates a simulated eye diagram corresponding to the simulation of FIG. 8B with a via and pad rings;

FIGS. 12A-12D illustrate various stages and/or devices associated with the method of FIG. 11.

DETAILED DESCRIPTION OF SOME EXAMPLE EMBODIMENTS

Reference will now be made to the drawings to describe various aspects of example embodiments of the invention. It is to be understood that the drawings are diagrammatic and schematic representations of such example embodiments, and are not limiting the present invention, nor are they necessarily drawn to scale.

Figure 1A:
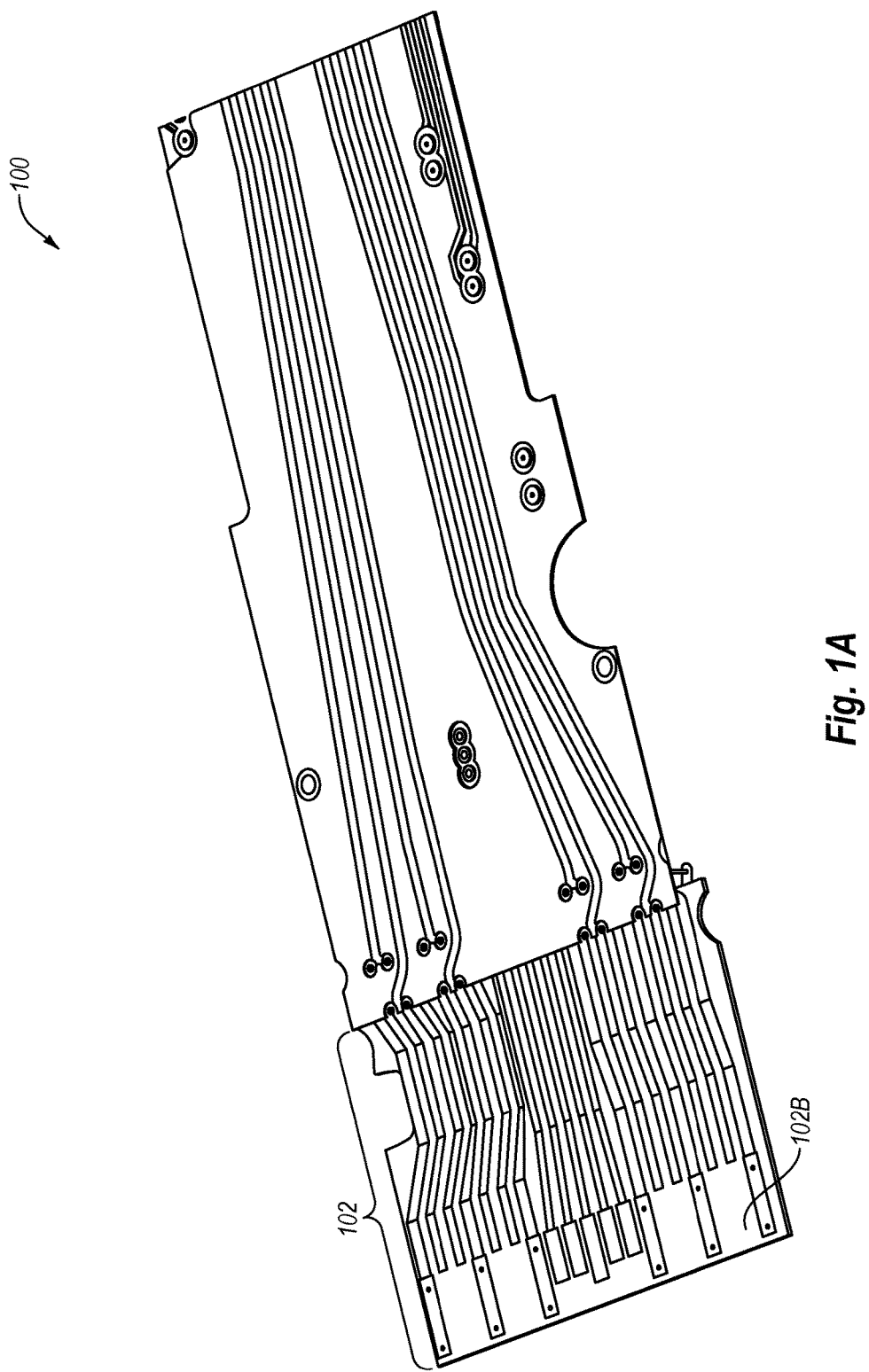
FIG. 1A is a perspective view of a PCB and a dual-sided edge connector coupled to the PCB.

FIG. 1A is a perspective view of a printed circuit board (PCB) 100 and a dual-sided edge connector 102 (hereinafter "edge connector 102") coupled to the PCB 100. The PCB 100 may generally include traces, pads, and other features etched from one or more copper sheets and laminated into a non-conductive substrate such as fiberglass and/or other suitable materials. The illustrated edge connector 102 may include a specialized microwave frequency material such as LTCC.

FIG. 1B illustrates a bottom side 102A of the edge connector 102 and FIG. 1C illustrates a top side 102B of the edge connector 102. Electrical traces 104A are included on the bottom side 102A of the edge connector 102 and electrical traces 104B are included on the top side 102B of the edge connector 102. Pad rings 106 on the bottom side 102B of the edge connector 102 may be electrically coupled through a substrate (not labeled) of the edge connector 102 to the traces 104A on the bottom side 102A of the edge connector 102 using vias (not shown).

The use of LTCC or other specialized microwave frequency material may enable vias with diameters down to about 50 microns. In contrast, the diameter of vias in a PCB, such as the PCB 100, may typically be not less than about 150 microns as described in more detail below.

Figure 2:
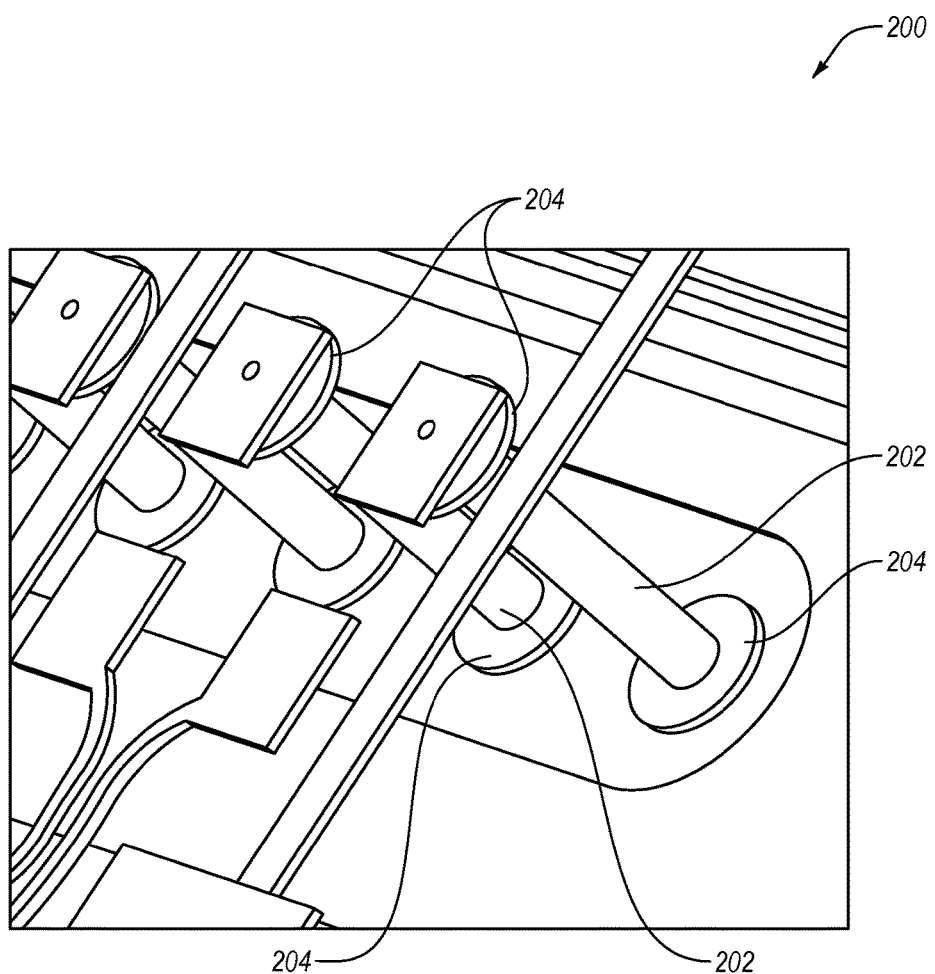
FIG. 2 illustrates vias that may be included in a PCB to form a dual-sided edge connector in the PCB without including a separate edge connector as in the example of FIGS. 1A-1C.

FIG. 2 illustrates vias 202 that may be included in a PCB 200 to, e.g., form a dual-sided edge connector in the PCB 200 without including a separate edge connector as in the example of FIGS. 1A-1C. In FIG. 2, a substrate of the PCB 200 is not illustrated to avoid obscuring the vias 202. As illustrated in FIG. 2, a pad ring 204 may be provided at each end of each via 202.

In a typical PCB, such as the PCB 200, a thickness of the substrate and thus a height of the vias 202 may be about 1 millimeter (mm). Each via 202 may be formed by forming a through hole in the substrate and then metallizing the through hole. Each via 202 may include the metallization formed in the corresponding through hole and/or may be referred to as a pillar. The aspect ratio of the vias 202, e.g., the ratio of the height to the diameter of each via 202, limits the diameter of each via 202 to not less than about 150 microns. In particular, in some embodiments, with a height of about 1 mm, drill sizes are limited to about 6 mils (approximately 150 microns). Drill sizes less than 6 mils may experience heavy yield losses.

Because the vias 202 may have a diameter of 150 microns or more, they may have to be anchored to the substrate of the PCB 200 using pad rings 204 that may have a diameter of 200 microns or more. The diameter of the pad rings 204 may be selected to securely anchor the vias within the substrate of the PCB 200 in a manner that prevents relative movement of the vias 202 as a result of forces exerted on each other from mutual inductive coupling. However, the relatively large size of the pad rings 204 causes substantial parasitic capacitance which can negatively impact performance of the PCB 200 in high speed applications, such as at frequencies of 14 gigahertz (GHz) or more.

Moreover, to maintain a desired impedance, the relatively large diameter of the pad rings 204 and the vias 202 limits a center-to-center spacing, or pitch, of the vias 204 to not less than a minimum pitch of about three to four times the diameter of the vias 202. The minimum pitch may limit the density of vias 202 in the PCB 200 and/or may limit the amount of area of the PCB 200 useable for other purposes.

FIG. 3 depicts two pillars 302 that may be included as vias in a PCB and various parameters that may be associated therewith, arranged in accordance with at least some embodiments described herein. In particular, each pillar 302 may have a diameter D and the pillars 302 may have a center-to-center spacing d.

FIG. 3 additionally depicts various equations 304, 306, 308, and 310 for determining other parameters of the pillars 302. In particular, inductance L between the pillars 302 may be determined according to equation 304, capacitance C between the two pillars 302 may be determined according to equation 306, mutual inductive coupling M between the pillars 302 may be determined according to equation 308, and differential impedance $Z_0$ between the two pillars 302 may be determined according to equation 310. In equations 304, 306, 308, and 310, $\mu_0$ is the magnetic permeability of free space, $\mu_r$ is magnetic permeability of a material between the pillars 302, ln is the natural log function, and H is a height of the pillars 302. It can be determined from equations 304, 306, 308, and 310 that the smaller the diameter D of the pillars 302 and the larger the center-to-center spacing d, the higher the differential impedance $Z_0$. Relatively higher differential impedance $Z_0$ may result in relatively better performance in high speed applications as compared to relatively lower differential impedance $Z_0$.

Accordingly, embodiments described herein relate to PCBs with micro vias, e.g., vias having a diameter of about 100 microns or less.

Figure 4A:
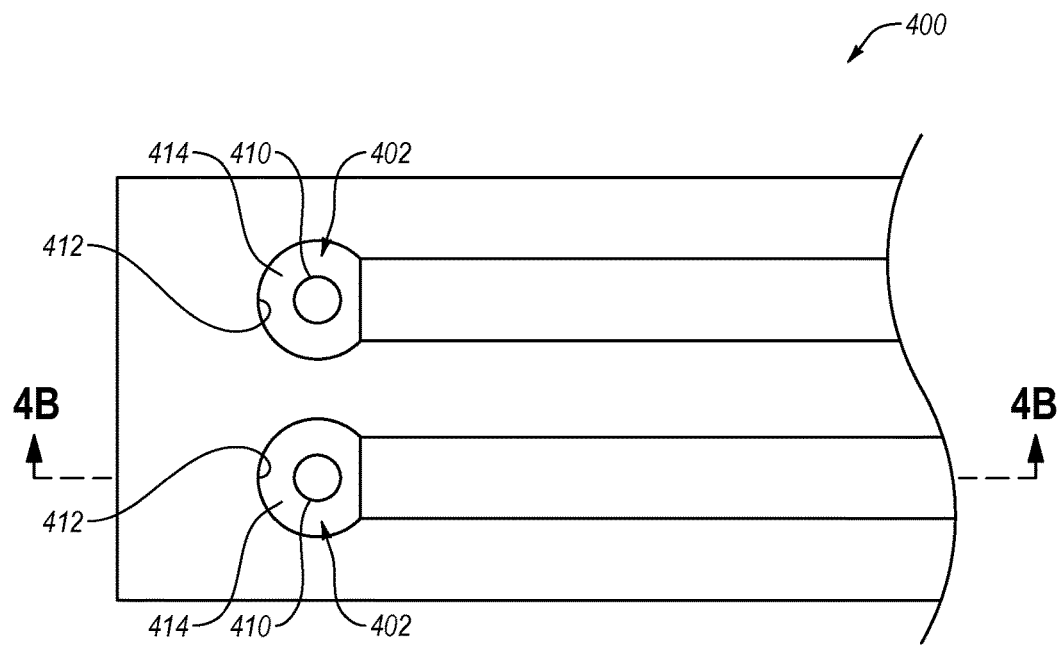
FIGS. 4A and 4B include a top view and a cross-sectional view of a PCB including micro vias.
Figure 4B:
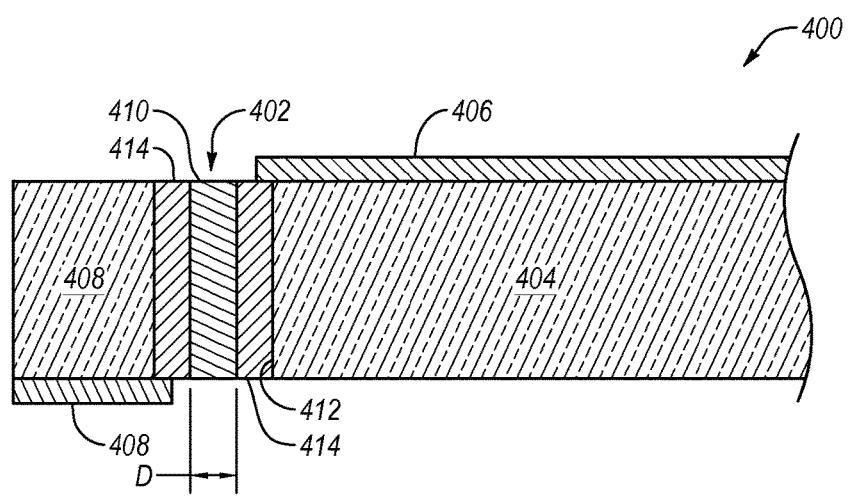

FIGS. 4A and 4B include a top view and a cross-sectional view of a PCB 400 including micro vias 402, arranged in accordance with at least some embodiments described herein. The cross-sectional view of FIG. 4B may be along cutting plane line 4B-4B in FIG. 4A.

With combined reference to FIGS. 4A and 4B, the PCB 400 may include a PCB substrate 404 and the micro vias 402. Although two micro vias 402 are illustrated in FIG. 4A, more generally, the PCB 400 may include one or more micro vias 402. Each of the micro vias 402 may have a diameter D (FIG. 4B) less than or equal to about 100 microns. For instance, the diameter D may be less than or equal to about 100 microns, less than or equal to about 50 microns, or less than or equal to about 25 microns.

The PCB 400 may further include one or more electrical traces 406 (hereinafter "traces 406") coupled to a first surface, e.g., a top surface, of the PCB substrate 404, and one or more electrical traces 408 (hereinafter "traces 408") coupled to an opposing second surface, e.g., a bottom surface, of the PCB substrate 404. The diameter D of each of the micro vias 402 may be less than or equal to a width w (see FIG. 4A) of the traces 406 in some embodiments. In other embodiments, the diameter D of each of the micro vias 402 may be greater than or equal to the width w of the traces 406.

The PCB substrate 404 may include a non-conductive material such as, but not limited to, fiberglass. Although not illustrated in FIGS. 4A and 4B, the PCB 400 may include one or more traces, pads, and/or other features etched from one or more copper sheets and laminated into the PCB substrate 404 in addition to the traces 406 and 408.

Figure 6A:
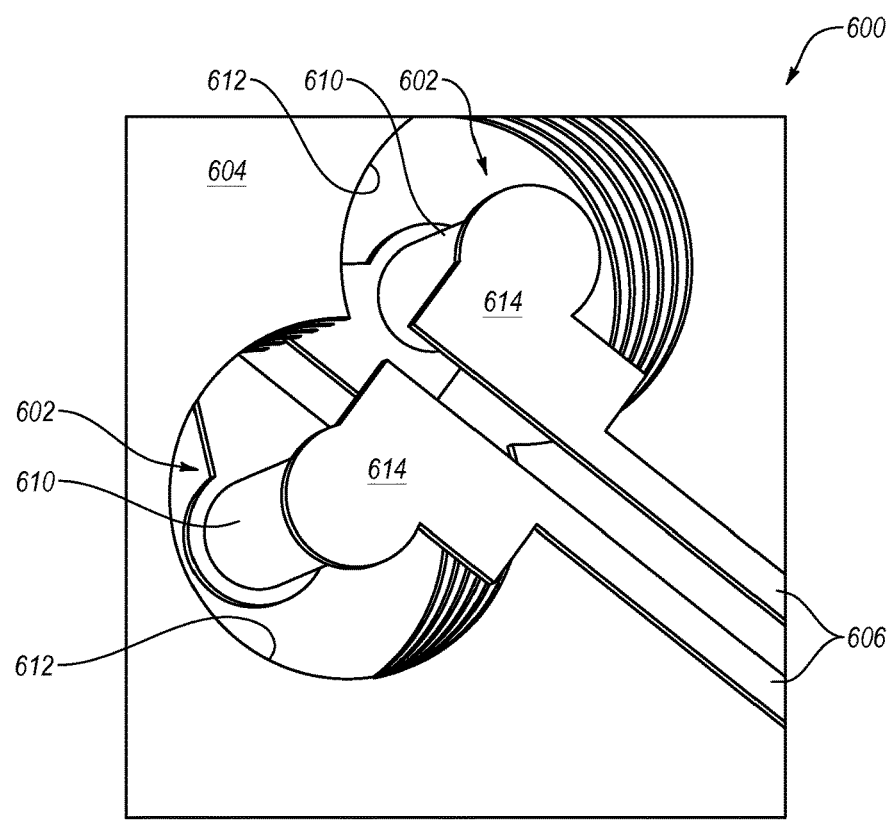
FIGS. 6A and 6B include a top view and a bottom view, respectively, of a PCB including micro vias.
Figure 6B:
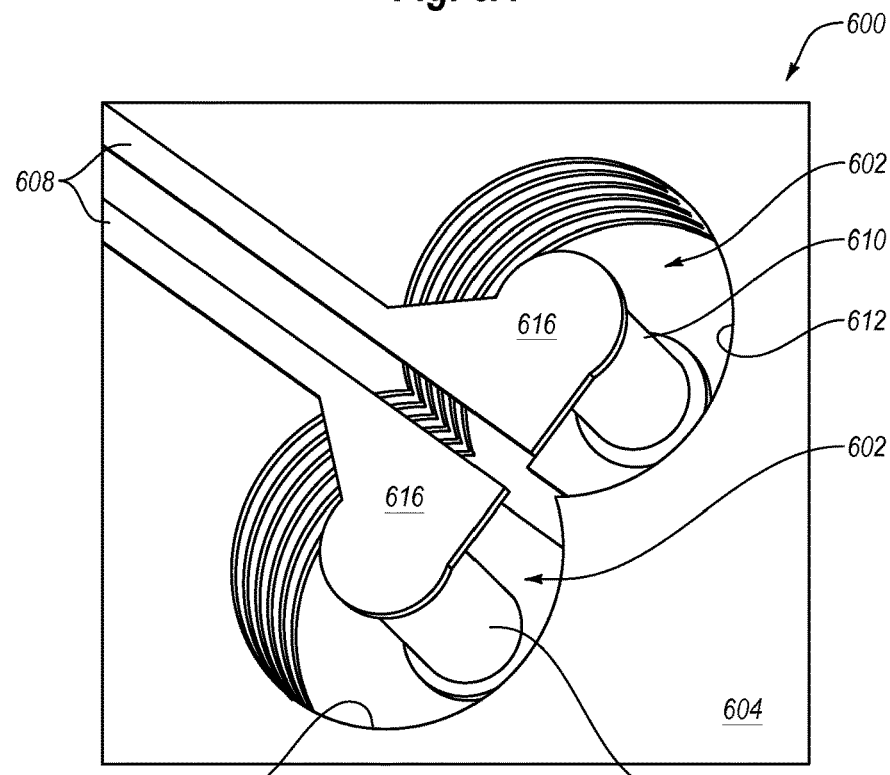

Alternately or additionally, and although not illustrated in FIGS. 4A and 4B, the PCB 400 may further include various plated or screen printed contacts, each electrically coupling a corresponding one of the traces 406 or 408 to an upper or lower end of a corresponding one of the micro vias 402. For instance, one plated or screen printed contact on the first or top surface of the PCB substrate 404 may electrically couple the trace 406 of FIG. 4B to an upper end of the micro via 402 of FIG. 4B, while another plated or screen printed contact on the second or bottom surface of the PCB substrate 404 may electrically couple the trace 408 to a lower end of the micro via 402 of FIG. 4B. Some example plated or screen printed contacts are illustrated in FIGS. 6A, 6B, and 12D, all described below.

Each of the micro vias 402 may include a pillar 410 that is electrically conductive and that is positioned within a through hole 412 formed in the PCB substrate 402. Each of the pillars 410 may include, but is not limited to, a metallized optical fiber, an electrically conductive micro rod, a metallized carbon micro rod, an electrically conductive wire, or other suitable pillar having a diameter less than or equal to about 100 microns.

The PCB 400 may further include an epoxy backfill 414 surrounding the pillar 410 within each through hole 412. The epoxy backfill 414 may be configured to electrically insulate the pillars 410 from the PCB substrate 404. In general, the epoxy backfill 414 may include a high frequency dielectric with a low dissipation factor. For example, the epoxy backfill 414 may include a dielectric that retains its dielectric properties at frequencies above 10 GHz and that has a dissipation factor less than or equal to about 0.002.

Optionally, one or more of the through holes 412 may have electrically conductive plating (not shown in FIGS. 4A and 4B) that plates the through hole 412 and surrounds the epoxy backfill 414 within the through hole 412. Each pillar 410 and electrically conductive plating in a given one of the through holes 412 may collectively form a coaxial micro via.

FIGS. 5A and 5B illustrate multi-axial vias 500A and 500B, arranged in accordance with at least some embodiments described herein. In particular, FIG. 5A illustrates a twinaxial via 500A including two pillars 502. The pillars 502 may include the same or similar materials as the pillars 410 of FIGS. 4A and 4B. Additionally, both pillars 502 may be positioned within a common through hole 504 formed in a PCB substrate (not shown).

An epoxy backfill 506 may surround the pillars 502 within the through hole 504. The epoxy backfill 506 may include the same or similar materials as the epoxy backfill 414 of FIGS. 4A and 4B.

FIG. 5A additionally illustrates an electrically conductive plating 508 that plates the through hole 504 and surrounds the epoxy backfill 506 within the through hole 504. The electrically conductive plating 508 is an example of the electrically conductive plating that may be applied to the through holes 412 of FIGS. 4A and 4B.

FIG. 5B illustrates a quadaxial via 500B including four pillars 502 surrounded by the epoxy backfill 506 and the electrically conductive plating 508 within the through hole 504.

Although FIGS. 5A and 5B depict multi-axial vias 500A and 500B including, respectively, two and four pillars 502, more generally, multi-axis vias according to the embodiments described herein may include two or more pillars 502.

FIGS. 6A and 6B include a top view and a bottom view, respectively, of a PCB 600 including micro vias 602, arranged in accordance with at least some embodiments described herein. The micro vias 602 may correspond to the micro vias 402 of FIGS. 4A and 4B, for example. The PCB 600 further includes a PCB substrate 604, electrical traces 606 (hereinafter "traces 606") on the top surface of the PCB 600, and electrical traces 608 (hereinafter "traces 608") on the bottom surface of the PCB 600.

The micro vias 602 may each include a pillar 610 generally corresponding to the pillars 410 of FIGS. 4A and 4B. The pillars 610 may be positioned within corresponding through holes 612. In FIGS. 6A and 6B, the through holes 612 are illustrated as connected, e.g., not separated from each other by the PCB substrate 604. In other embodiments, the through holes 612 may be separated from each other by the PCB substrate 604.

The pillars 610 may be surrounded by an epoxy backfill within the through holes 612. To avoid obscuring the pillars 610, however, the epoxy backfill is not illustrated in FIGS. 6A and 6B.

In FIGS. 6A and 6B, the PCB 600 further includes plated or screen printed contacts 614 on the top surface of the PCB substrate 604 that electrically couple the electrical traces 606 to top ends of the pillars 610, as well as plated or screen printed contacts 616 on the bottom surface of the PCB substrate 604 that electrically couple the electrical traces 608 to bottom ends of the pillars 610. In the illustrated embodiment, a diameter of the pillars 610 is relatively small such that relatively large pad rings are not needed as in the PCB 200 of FIG. 2. Various simulations associated with the PCB 600 of FIGS. 6A and 6B are provided in FIGS. 10A and 10B below.

Figure 7A:
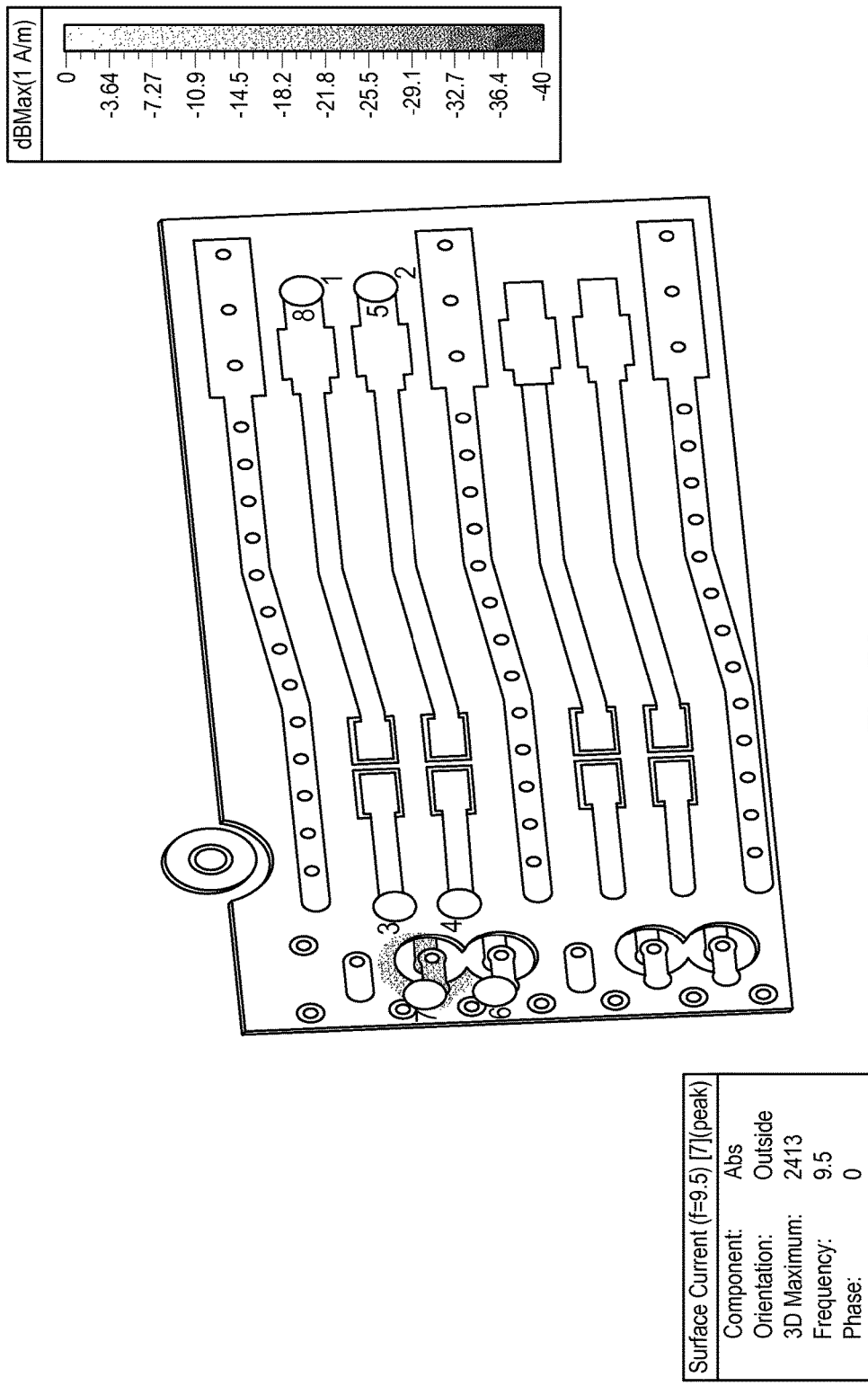
FIG. 7A illustrates simulated surface current generated by exciting a port within a PCB such as the PCB of FIG. 2.

FIG. 7A illustrates simulated surface current generated by exciting a port within a PCB such as the PCB 200 of FIG. 2. In particular, port 7 in FIG. 7A may be coupled to a via having a relatively large diameter and relatively large pad rings, such as one of the vias 202 and pairs of pad rings 204 of FIG. 2. Exciting port 7 results in surface current being spread around the port because the via scatters the energy, which may be picked up in port 6.

FIG. 7B illustrates simulated h-field generated by exciting a port within a PCB such as the PCB 200 of FIG. 2. In particular, port 6 in FIG. 7B may be coupled to a via having a relatively large diameter and relatively large pad rings, such as one of the vias 202 and pairs of pad rings 204 of FIG. 2. Exciting port 6 causes a relatively large h-field that spreads into port 7.

Figure 8A:
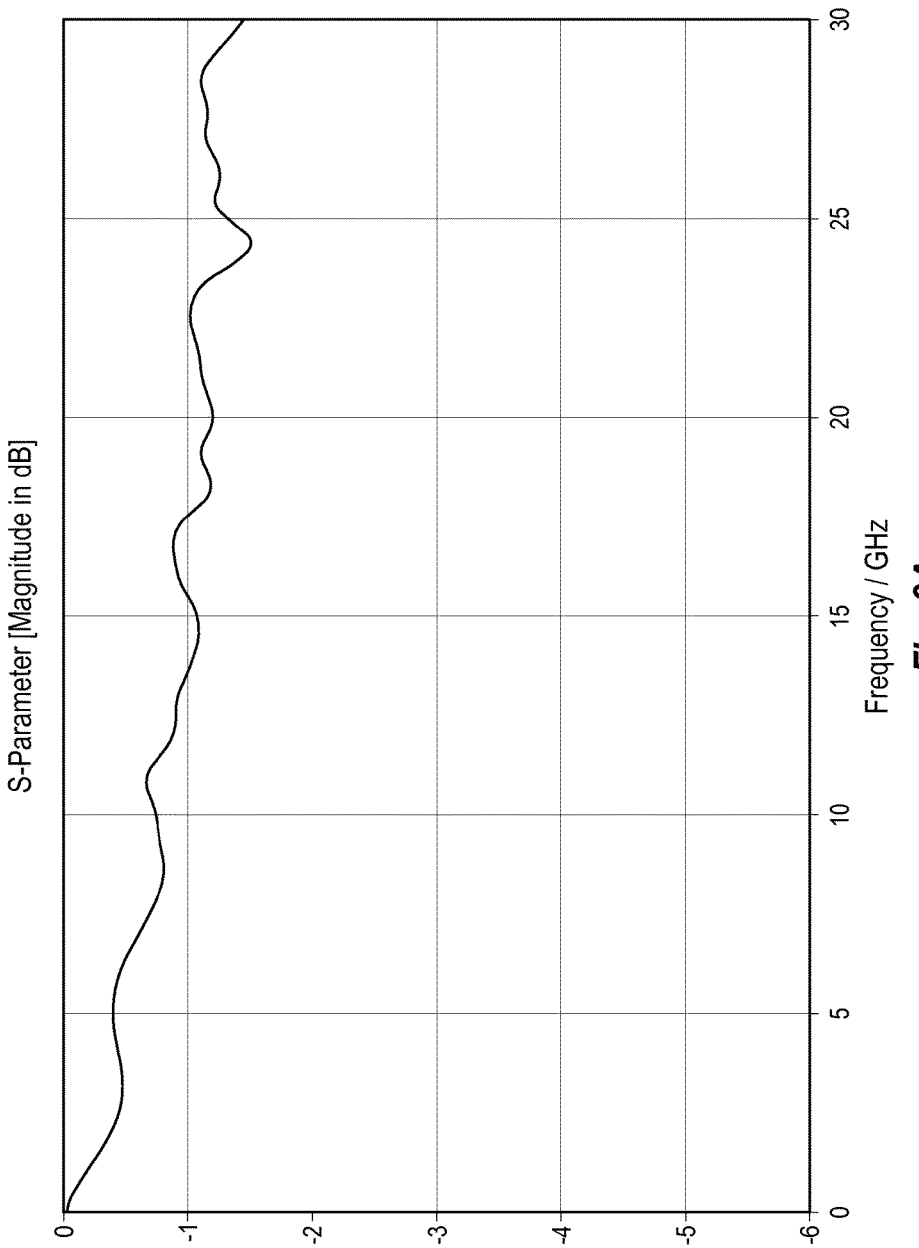
FIG. 8A illustrates simulated S21 performance between ports interconnected without a via and pad rings such as one of the vias and pairs of pad rings of FIG. 2.

FIG. 8A illustrates simulated S21 performance between ports interconnected without a via and pad rings such as one of the vias 202 and pairs of pad rings 204 of FIG. 2. The S21 performance in FIG. 8A is relatively good. For instance, at a frequency of 15 GHz, the loss is only about 1 decibel (dB) and at 30 GHz, the loss is less than 1.5 dB.

Figure 8B:
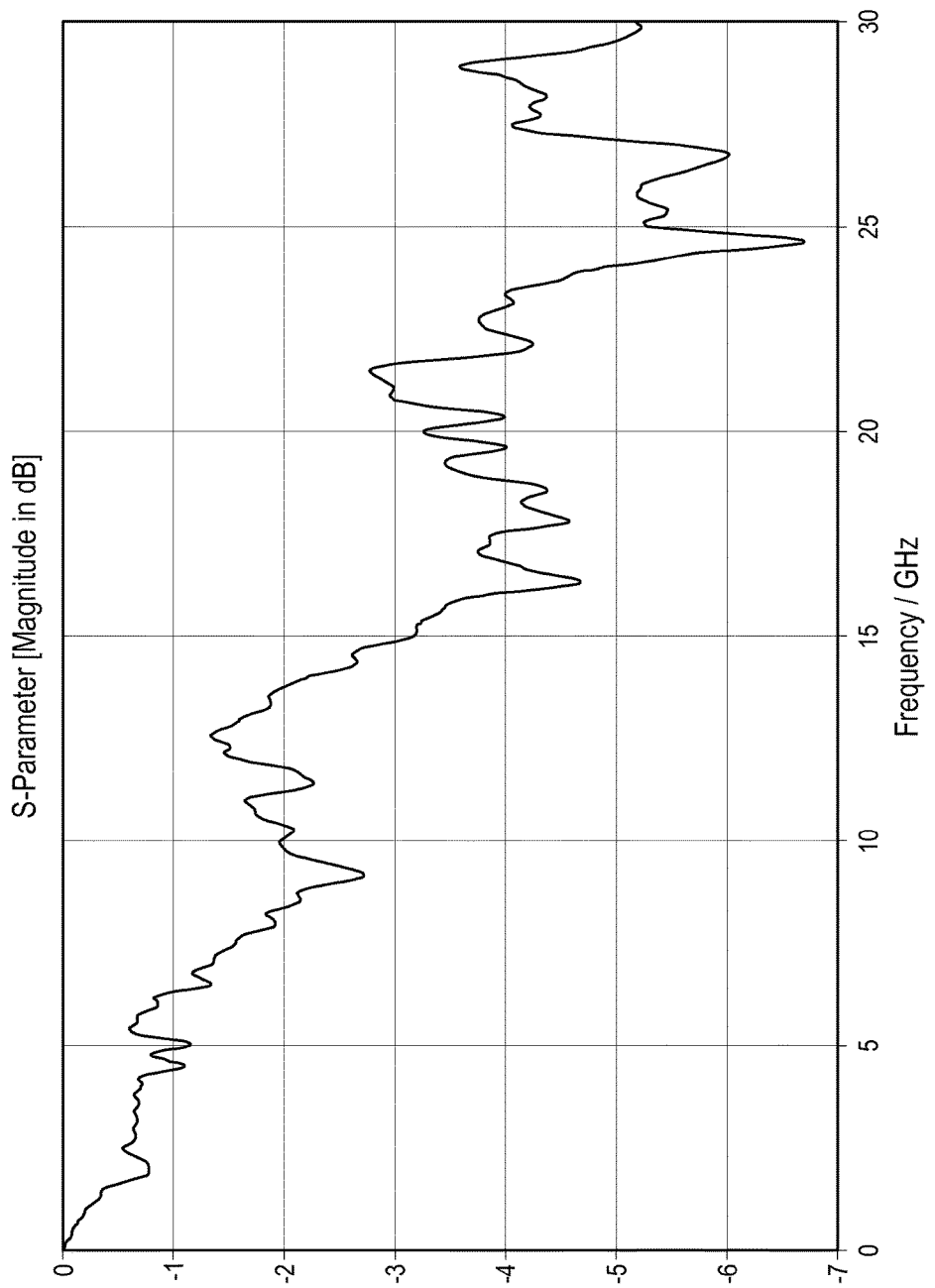
FIG. 8B illustrates simulated S21 performance between ports interconnected with a via having a height of 1 mm and pad rings, such as the via and pad rings of FIG. 2.

FIG. 8B illustrates simulated S21 performance between ports interconnected with a via having a height of 1 mm and pad rings, such as the via 202 and pad rings 204 of FIG. 2. The S21 performance in FIG. 8B is significantly degraded compared to the S21 performance of FIG. 8A. For instance, at 15 GHz, the loss is about 3 decibel (dB) and at 30 GHz, the loss is about 5 dB in FIG. 8B.

Figure 9A:
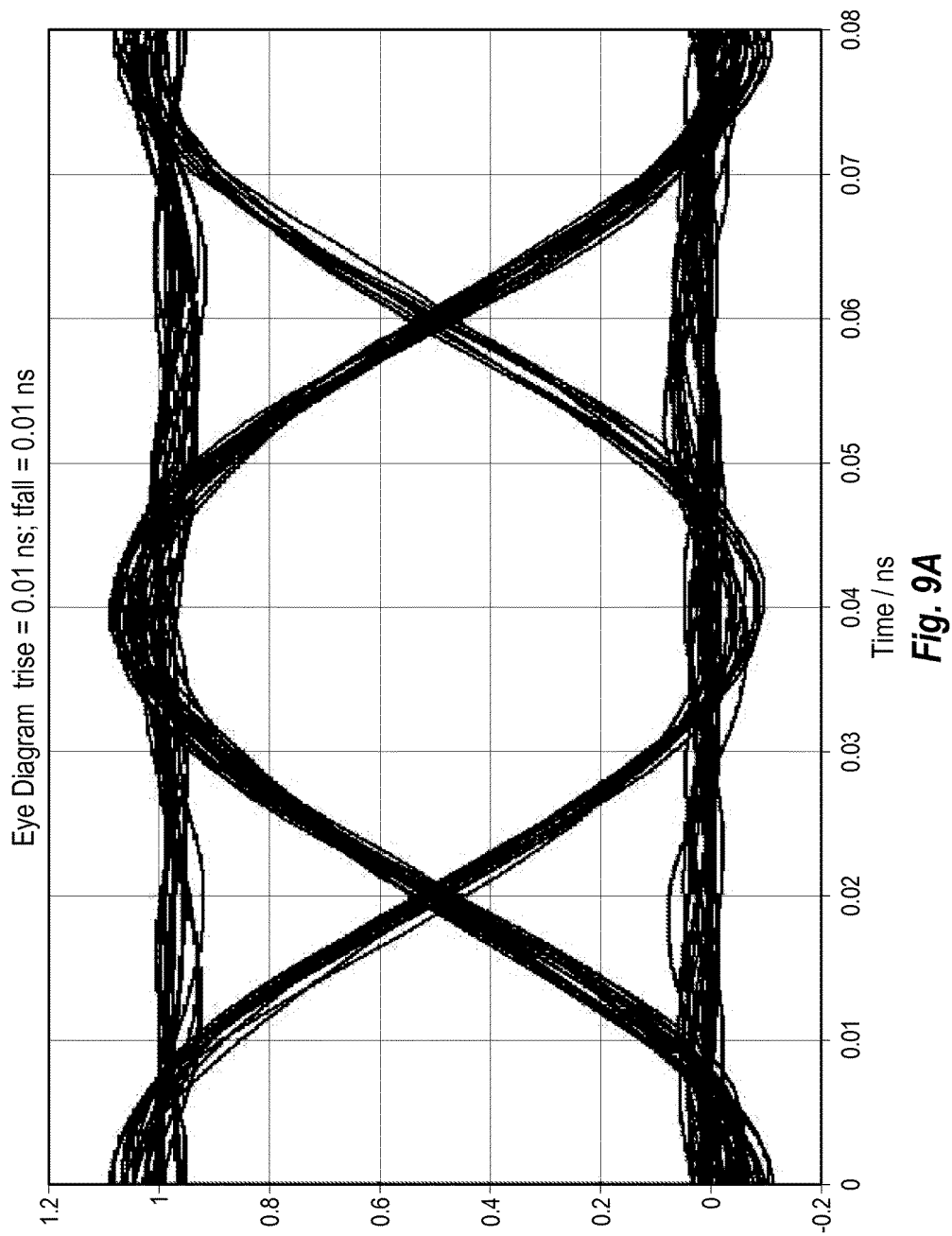
FIG. 9A illustrates a simulated eye diagram corresponding to the simulation of FIG. 8A without a via and pad rings.

FIG. 9A illustrates a simulated eye diagram corresponding to the simulation of FIG. 8A without a via and pad rings. FIG. 9B illustrates a simulated eye diagram corresponding to the simulation of FIG. 8B with a via and pad rings. The eye diagram is more closed and distorted in the simulation of FIG. 9B as compared to the simulation of FIG. 9A as a result of the via and pad rings.

Figure 10A:
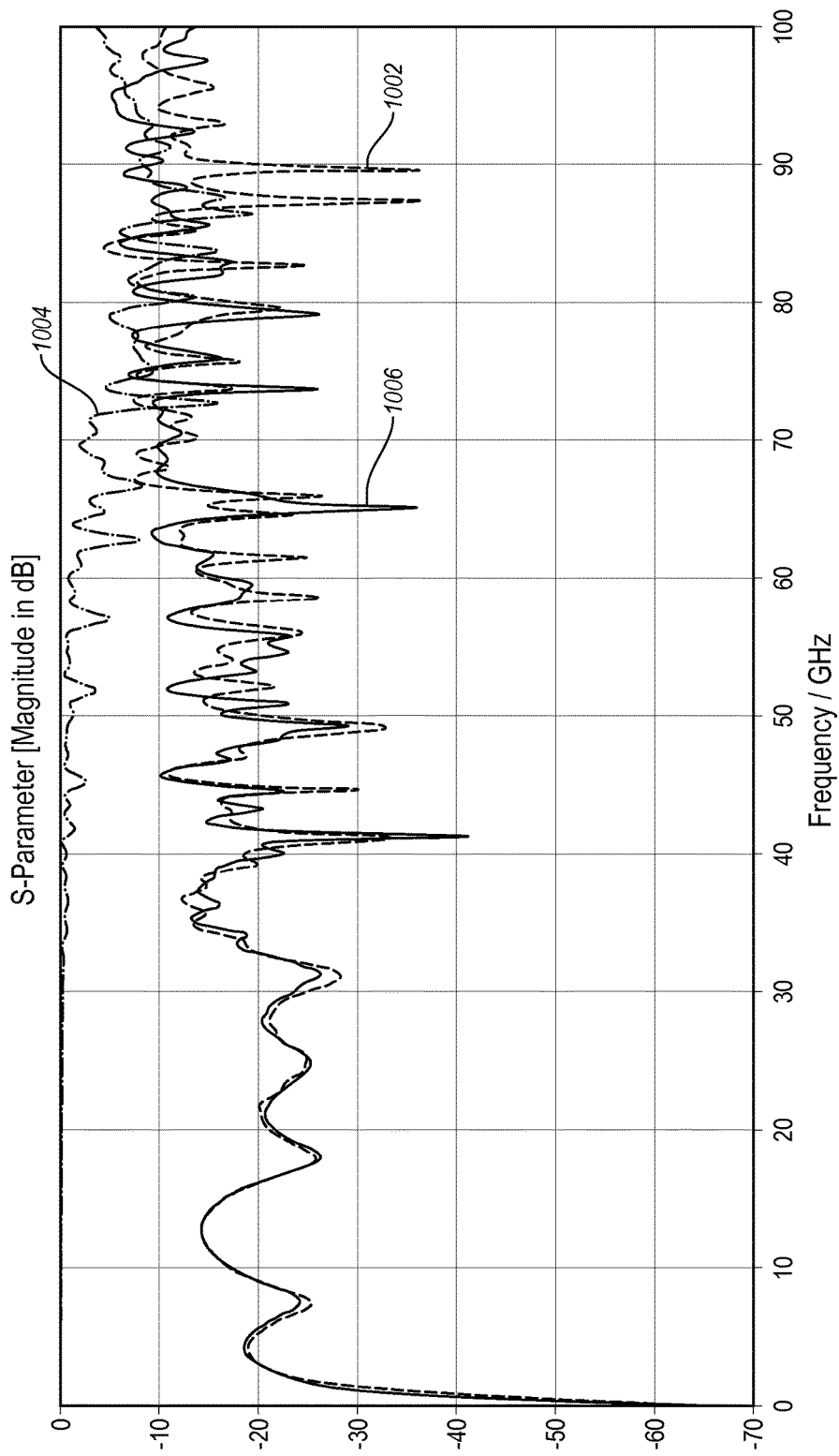
FIGS. 10A and 10B illustrate simulated S parameter performance for the PCB of FIGS. 6A and 6B.
Figure 10B:
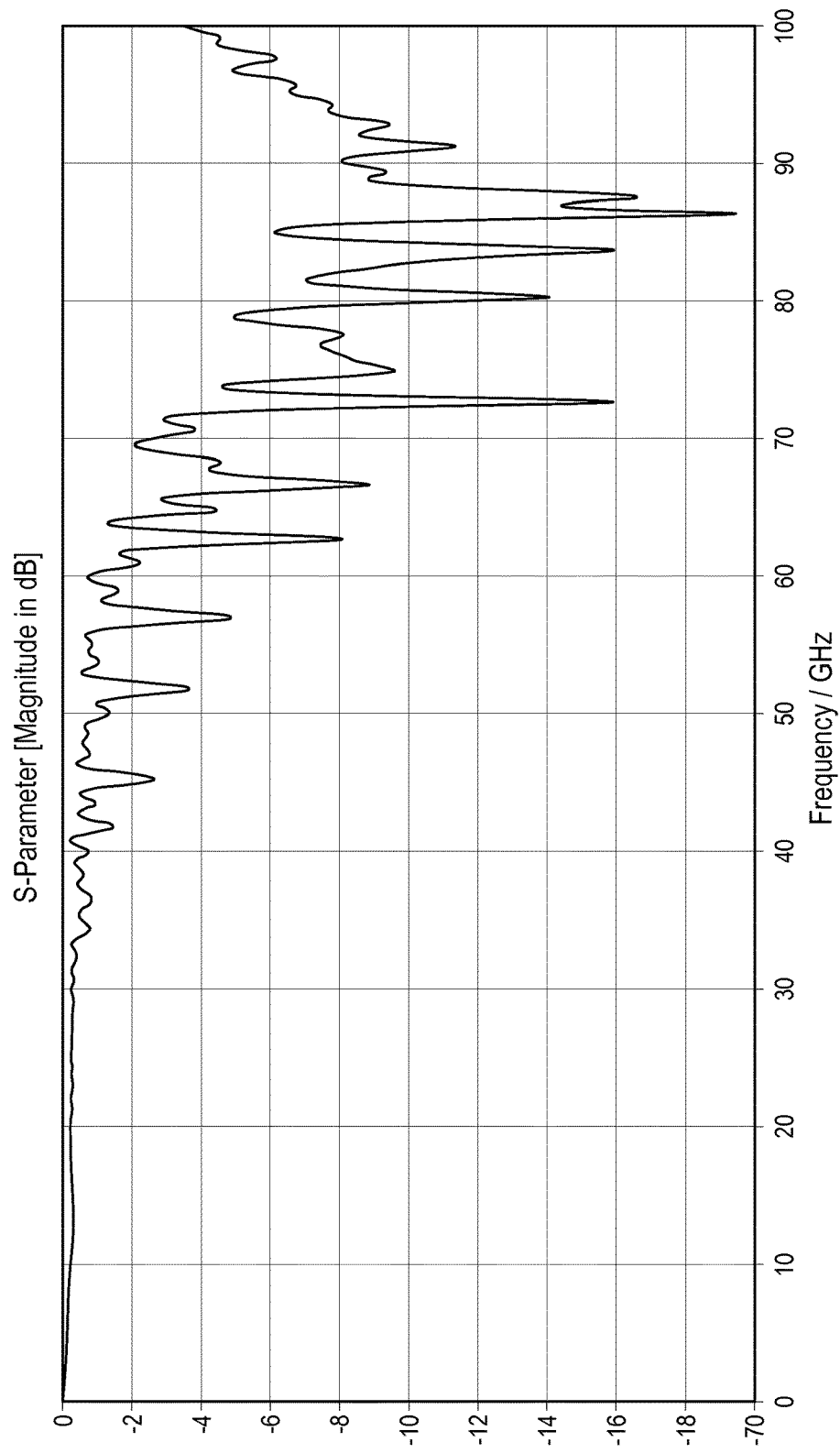

FIGS. 10A and 10B illustrate simulated S parameter performance for the PCB 600 of FIGS. 6A and 6B, arranged in accordance with at least some embodiments described herein. In particular, FIG. 10A includes curves 1002, 1004, 1006 respectively corresponding to the S11, S12, and S22 performance of the PCB 600 of FIGS. 6A and 6B.

FIG. 10B illustrates simulated S21 performance of the PCB 600 of FIGS. 6A and 6B. The simulated S21 performance of the PCB 600 with micro vias according to embodiments described herein is significantly better than the S21 performance of FIG. 8B between ports interconnected with a via and pad rings, such as the via 202 and pad rings 204 of FIG. 2. For instance, in FIG. 10B, the loss is less than 1 dB for all frequencies less than 40 GHz.

Figure 11:
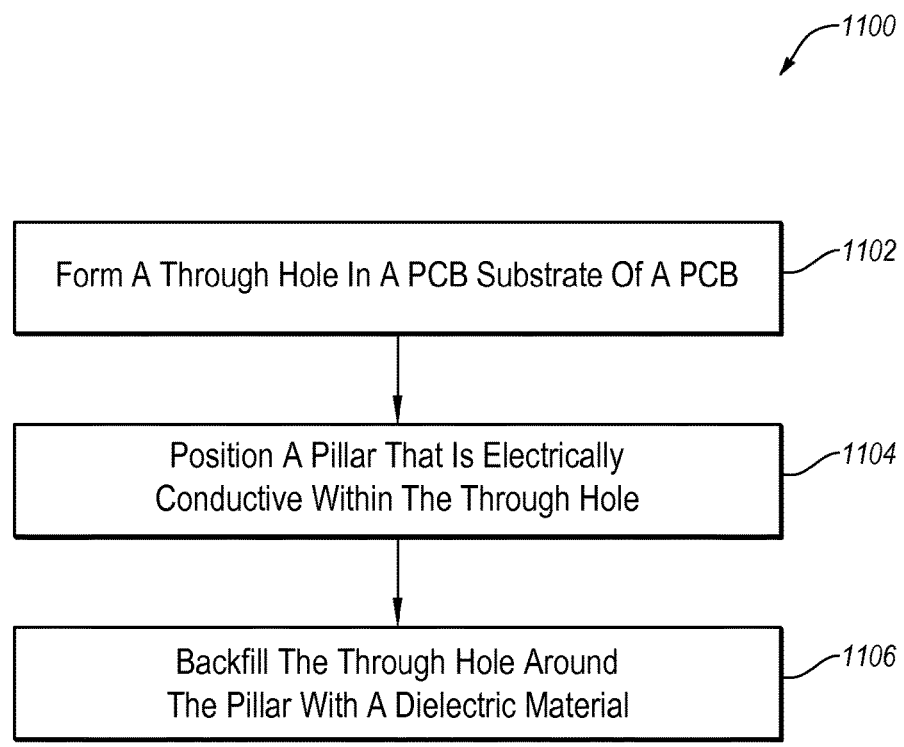
FIG. 11 is a flowchart of an example method of forming micro vias in a PCB.

FIG. 11 is a flowchart of an example method 1100 of forming micro vias in a PCB, arranged in accordance with at least some embodiments described herein. Although illustrated as discrete blocks, various blocks may be divided into additional blocks, combined into fewer blocks, or eliminated, depending on the desired implementation.

The method 1100 may begin at block 1102 in which a through hole is formed in a PCB substrate of a PCB.

At block 1104, a pillar that is electrically conductive may be positioned within the through hole. Alternately or additionally, multiple pillars may be positioned within the same through hole to form a multi-axial via, such as the multi-axial vias 500A and 500B of FIGS. 5A and 5B.

Positioning the pillar within the through hole may include drop inserting the pillar into the through hole. Alternately, positioning the pillar within the through hole may include feeding an electrically conductive elongate material into the through hole, the pillar including a portion of the electrically conductive elongate material remaining within the through hole after the electrically conductive elongate material is cut at one or both opposing surfaces of the PCB substrate. The electrically conductive elongate material may include, for instance, a metallized optical fiber, an electrically conductive micro rod, a metallized carbon micro rod, an electrically conductive wire, or the like.

At block 1106, the through hole may be backfilled around the pillar with a dielectric material. Where multiple pillars are positioned within the same through hole, the through hole may be backfilled around all of the pillars.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 1100 may further include, prior to positioning the pillar within the through hole, coupling an alignment mask to the PCB substrate, the alignment mask including an opening aligned with the through hole through which the pillar is inserted or fed into the through hole. In this and other embodiments, backfilling the through hole around the pillar with a dielectric material as described with respect to block 1106 may include feeding a dielectric epoxy through the opening of the alignment mask into the through hole around the pillar.

Alternately or additionally, the method 1100 may further include providing a spacer layer between the alignment mask and the PCB substrate. The method 1100 may further include cutting through a portion of the spacer layer to remove a portion of the pillar extending beyond a first surface of the PCB substrate or beyond an opposing second surface of the PCB substrate using a disc saw. The spacer layer may include wax.

Alternately or additionally, the method 1100 may further include, prior to positioning the pillar within the through hole or backfilling the through hole around the pillar, plating the through hole with an electrically conductive plating such that the pillar and the electrically conductive plating collectively form a coaxial micro via.

Alternately or additionally, the method 1100 may further include forming a contact that electrically couples an electrical trace on a first surface of the PCB substrate to a first end of the pillar that extends to the first surface of the PCB substrate. Forming the contact may include plating or screen printing an electrically conductive material on the first surface of the PCB substrate in electrical contact with the electrical trace and the first end of the pillar. An example of an apparatus suitable for plating or screen printing such contacts is marketed by MYDATA as the MY500 jet printer.

The method 1100 and/or its variants described herein may be implemented to produce a PCB, such as the PCB 400 of FIGS. 4A and 4B and/or the PCB 600 of FIGS. 6A and 6B, having micro vias such as the micro vias 402 of FIGS. 4A and 4B, the micro vias 602 of FIGS. 6A and 6B, coaxial micro vias as described herein, and/or multi-axial vias such as the multi-axial vias 500A and 500B of FIGS. 5A and 5B.

Figure 12B:
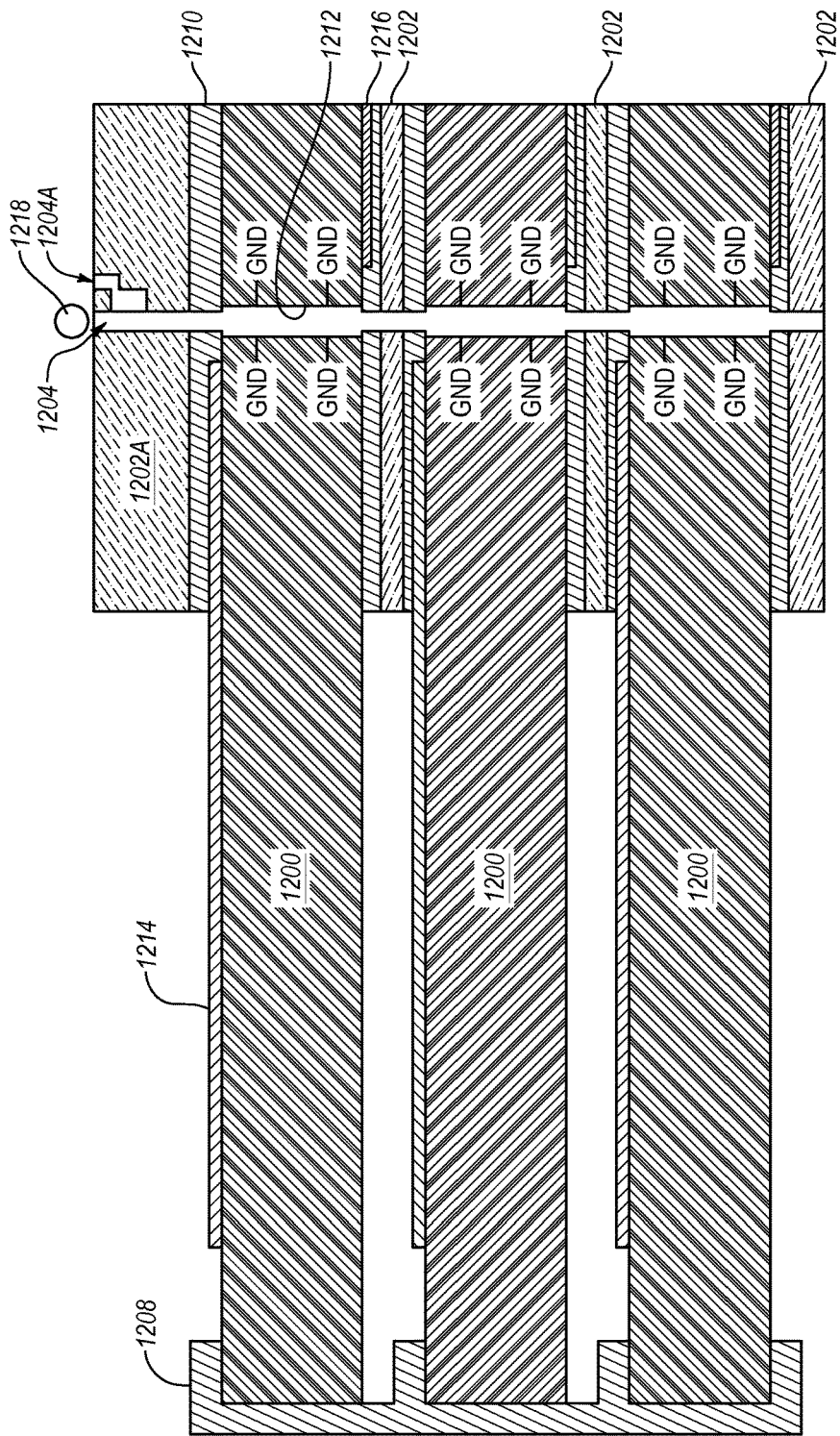
Figure 12C:
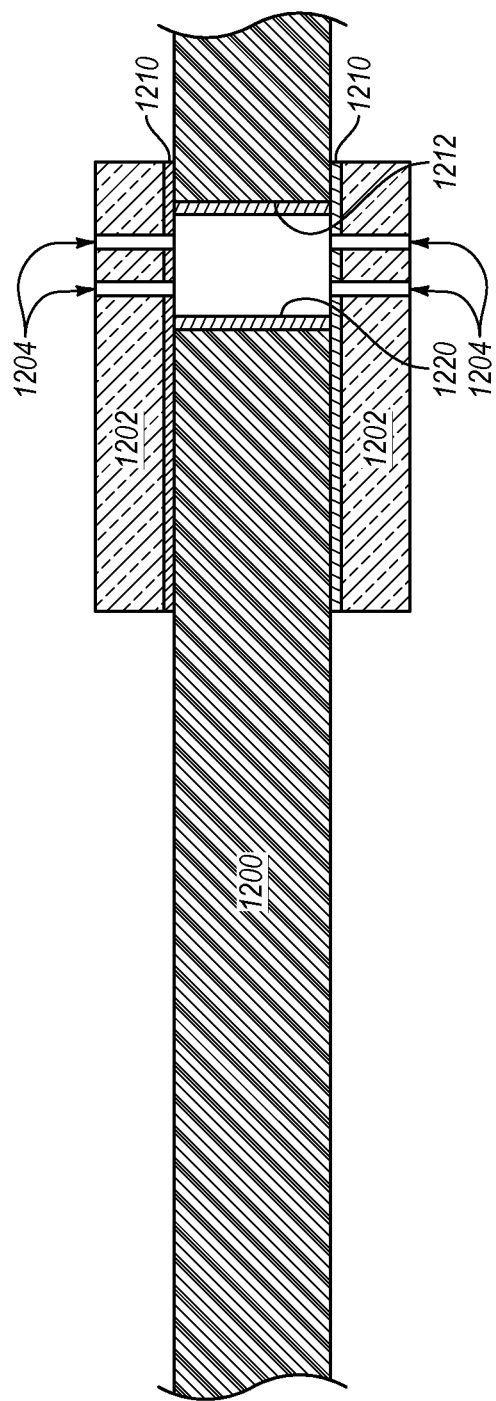
Figure 12D:
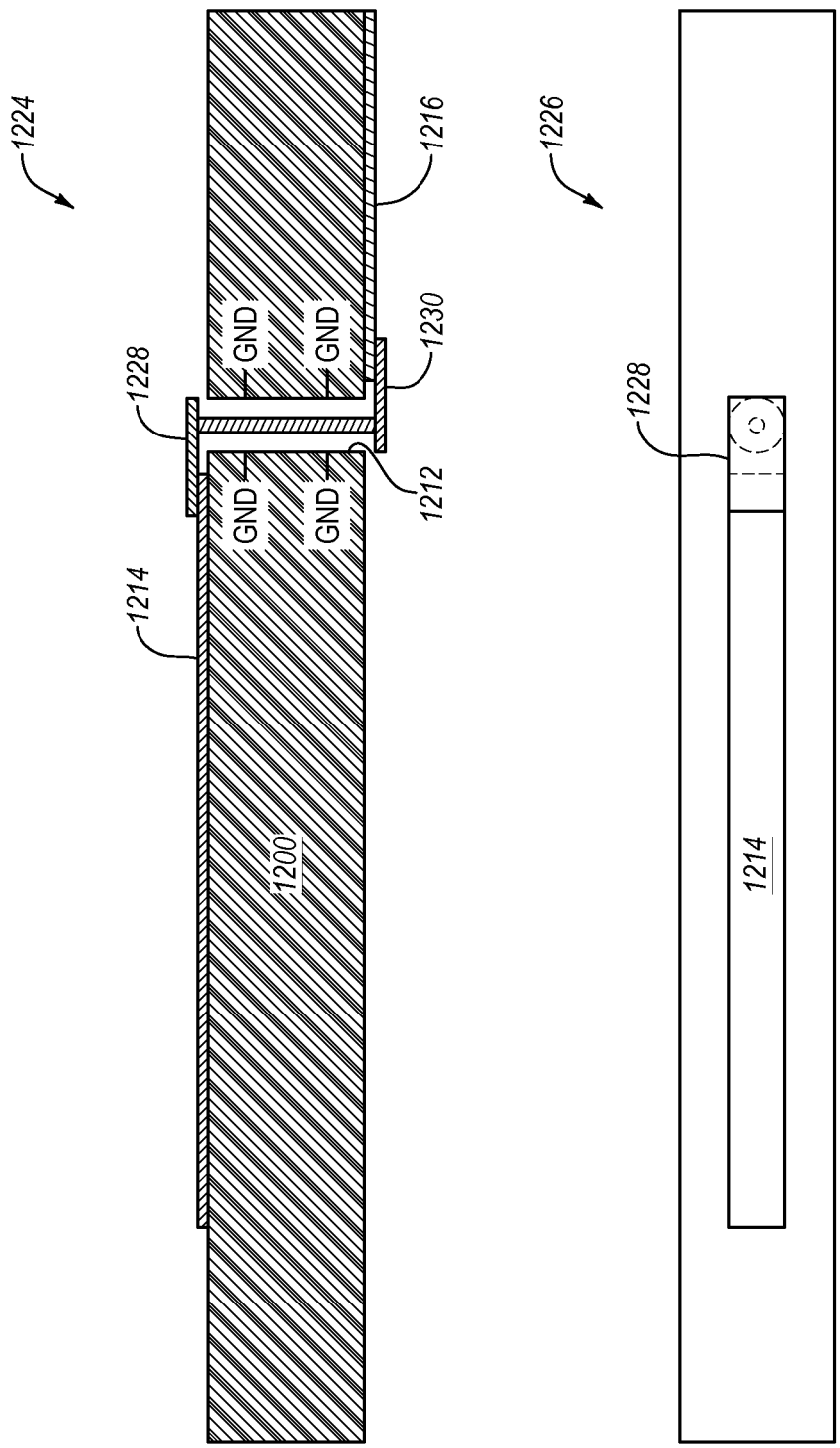

FIGS. 12A-12D illustrate various stages and/or devices associated with the method 1100 of FIG. 11 and/or its variants described above. In more detail, FIG. 12A is a top view of a PCB 1200 and an alignment mask 1202 coupled thereto. The alignment mask 1202 may include multiple openings 1204, each aligned with a different through hole formed in the PCB 1200. Fiducials 1206 may be provided to ensure alignment of the openings 1204 with the through holes formed in the PCB 1200. Each fiducial 1206 may include, for instance, a fiducial hole formed in the PCB 1200 and a fiducial post extending from the alignment mask 1202; each fiducial post may be received in the corresponding fiducial hole when the alignment mask 1202 is properly aligned with the PCB 1200.

FIG. 12B is a cross-sectional view of a system for forming micro vias in multiple PCBs 1200 simultaneously. A panel holding fixture 1208 may fixedly secure each of multiple PCBs 1200, sometimes referred to as panels. An alignment mask 1202 or 1202A may be provided on top and/or bottom of each PCB 1200. A spacer layer 1210 made of wax or other suitable material may be provided between each PCB 1200 and alignment mask 1202 or 1202A. Only one of the spacer layers 1210 is labeled in FIG. 12B.

Each PCB 1200 may include at least one through hole 1212 formed therein. Only one through hole 1212 is labeled in FIG. 12B. Optionally, the through holes 1212 may be metallized with electrically conductive plating that plates each through hole 1212.

Each PCB 1200 may additionally include at least one top trace 1214 and at least one bottom trace 1216. Only one top trace 1214 and one bottom trace 1216 are labeled in FIG. 12B.

A spool of electrically conductive elongate material is denoted at 1218. The electrically conductive elongate material 1218 may be fed through the opening 1204 of the top alignment mask 1202A and then down through the aligned through holes 1212 and openings 1204 to the bottom of the stack of PCBs 1200 so as to position a portion of the electrically conductive elongate material 1218 that will eventually be cut to individual pillars within each of the through holes 1212.

Epoxy backfill (not shown) may also be fed through the opening 1204 or through a separate opening 1204A of the top alignment mask 1202A and then down through the aligned through holes 1212 and openings 1204 to the bottom of the stack of PCBs 1200 so as to surround the electrically conductive elongate material 1218 within the through holes 1212.

After the epoxy backfill has cured, the electrically conductive elongate material 1218 may be cut. For instance, a disc saw having a kerf width that is less than a thickness of each spacer layer 1210 may be used to cut through each spacer layer 1210 and the electrically conductive elongate material 1218 such that a portion of the electrically conductive elongate material 1218 remaining within each through hole 1212 is a pillar having a height substantially equal to a thickness of the corresponding PCB 1200.

FIG. 12C is a cross-sectional view of a system for forming multi-axial micro vias in the PCB 1200. In the setup of FIG. 12C, each alignment mask 1202 may include multiple openings 1204 aligned with each through hole 1212. Particularly, each alignment mask 1202 in FIG. 12C includes two openings 1204 aligned with a single through hole 1212, thereby allowing two pillars to be positioned within the through hole 1212 prior to backfilling with epoxy backfill. FIG. 12C additionally illustrates an electrically conductive plating 1220 that plates the through hole 1212 and that may be formed prior to backfilling with the epoxy backfill.

FIG. 12D includes a cross-sectional side view 1224 and a top view 1226 of the PCB 1200 after formation of first and second contacts 1228 and 1230. In particular, the first contact 1228 may be formed on a first or top surface of the PCB 1200 that electrically couples the top trace 1214 to a top end of a pillar 1232 within the through hole 1212. The second contact 1230 may be formed on an opposing second or bottom surface of the PCB 1200 that electrically couples the bottom trace 1216 to a bottom end of the pillar 1232 with the through hole 1212.

Figure 13A:
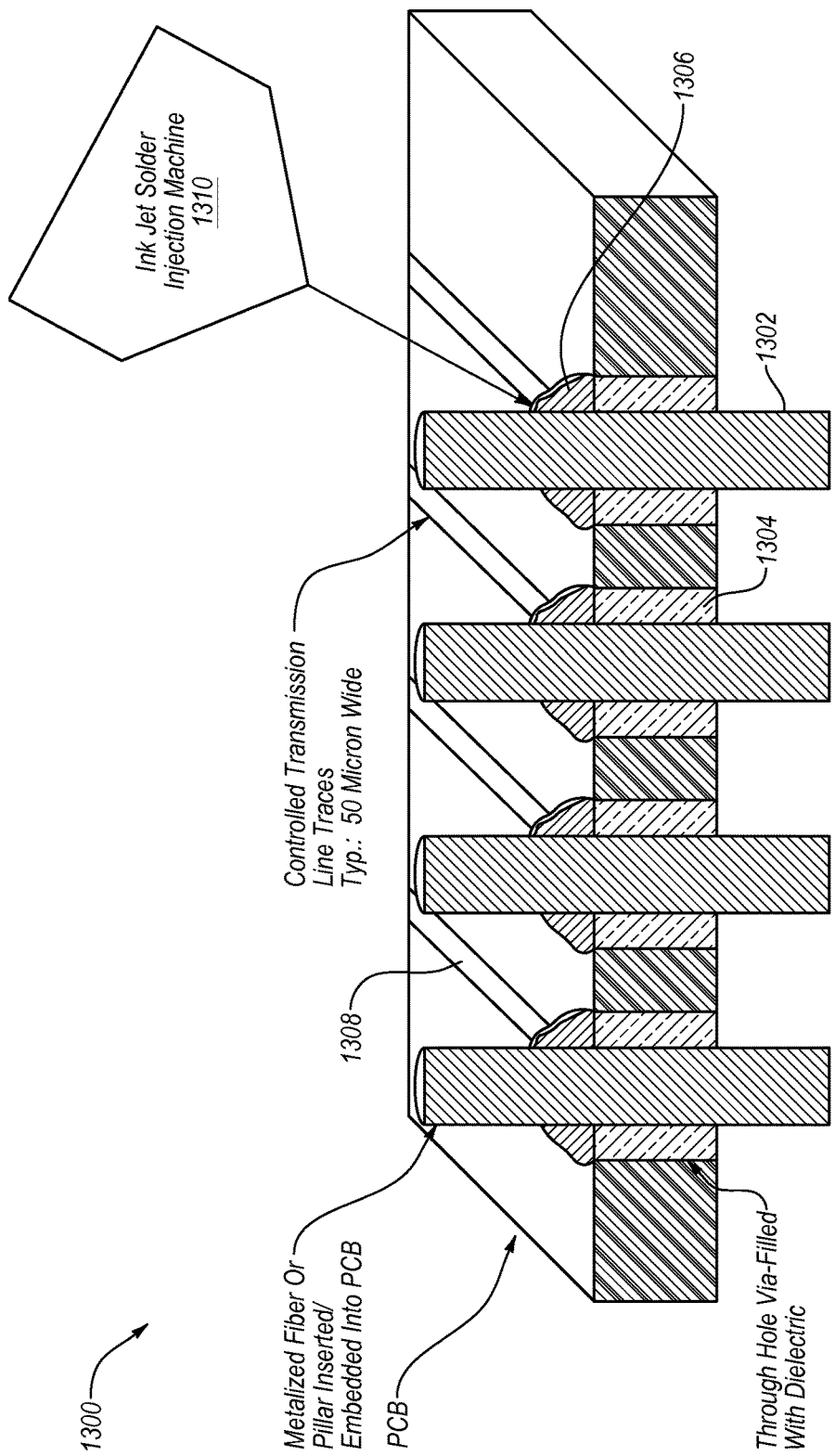
FIGS. 13A-13B illustrate additional stages and/or devices associated with the method of FIG. 11.
Figure 13B:
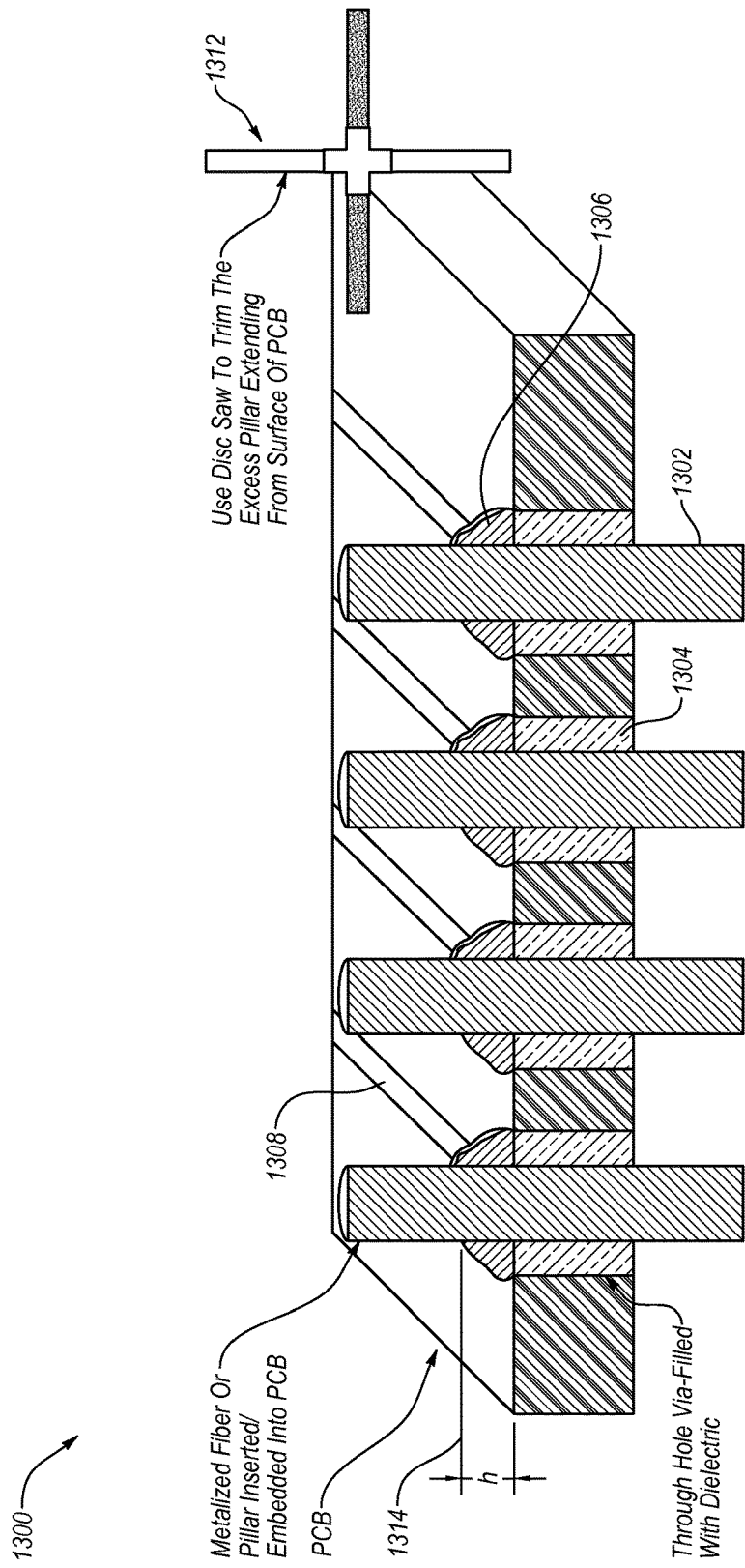

FIGS. 13A-13B illustrate additional stages and/or devices associated with the method 1100 of FIG. 11 and/or its variants described above. In more detail, FIGS. 13A and 13B include detail views of a PCB 1300 with electrically conductive pillars 1302 (only one of which is labeled), such as metallized fiber, positioned within through holes of the PCB 1300. An epoxy backfill 1304 (only one of which is labeled) of dielectric material is backfilled within the through holes around the pillars 1302.

FIG. 13A additionally depicts contacts 1306 (only one of which is labeled) that electrically couple the pillars 1302 to corresponding traces 1308 (only one of which is labeled) on the top surface of the PCB 1300. The contacts 1306 may be applied by an ink jet solder injection machine, denoted at 1310, for example. The previously mentioned MY500 jet printer marketed by MYDATA is an example of the ink jet solder injection machine 1310, which may be configured to plate, screen print, or ink jet print contacts on the PCB 1300.

After the contacts 1306 have been applied, the excess of the pillars 1302 may be trimmed. For instance, the excess of the pillars 1302 may be trimmed by, e.g., a disc saw, as denoted at 1312 in FIG. 13B. In an example embodiment, the excess of the pillars 1302 may be trimmed down to a height at or near (e.g., slightly above or below) a height of the contacts 1306. An example height to witch the pillars 1302 may be trimmed is denoted by reference line 1314 and height h in FIG. 13B.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or, "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of forming at least one micro via in a printed circuit board (PCB), the method comprising:
   forming a through hole in a PCB substrate of the PCB;
   positioning a pillar that is electrically conductive within the through hole;
   prior to positioning the pillar within the through hole, coupling an alignment mask to the PCB substrate, the alignment mask including an opening aligned with the through hole through which the pillar is inserted into the through hole;
   providing a spacer layer between the alignment mask and the PCB substrate;
   cutting through a portion of the spacer layer to remove a portion of the pillar extending beyond a first surface of the PCB substrate or beyond an opposing second surface of the PCB substrate; and
   subsequent to positioning the pillar, backfilling the through hole around the pillar with an epoxy backfill.

2. The method of claim 1, wherein positioning the pillar within the through hole comprises drop inserting the pillar into the through hole.

3. The method of claim 1, wherein positioning the pillar within the through hole comprises feeding an electrically conductive elongate material into the through hole, the pillar comprising a portion of the electrically conductive elongate material remaining within the through hole after the electrically conductive elongate material is cut at one or both opposing surfaces of the PCB substrate.

4. The method of claim 3, further comprising:
   forming an electrical contact coupled to the pillar; and
   cutting the electrically conductive elongate material at one or both opposing surfaces of the PCB substrate, including trimming the elongate material to a height slightly above or below a height of the contact.

5. The method of claim 1, wherein backfilling the through hole around the pillar with an epoxy backfill comprises feeding a dielectric epoxy through the opening of the alignment mask into the through hole around the pillar.

6. The method of claim 1, wherein cutting through the portion of the spacer layer comprises cutting through the portion of the spacer layer using a disc saw.

7. The method of claim 1, wherein the spacer layer comprises wax.

8. The method of claim 1, further comprising, prior to positioning the pillar within the through hole or backfilling the through hole around the pillar, plating the through hole with an electrically conductive plating such that the pillar and the electrically conductive plating collectively form a coaxial micro via.

9. The method of claim 8, wherein the electrically conductive plating that plates the through hole surrounds the epoxy backfill within the through hole.

10. The method of claim 1, further comprising positioning a second pillar that is electrically conductive within the through hole, wherein backfilling the through hole around the pillar with the epoxy backfill comprises backfilling the through hole around the pillar and around the second pillar with the epoxy backfill.

11. The method of claim 1, further comprising forming a contact that electrically couples an electrical trace on a first surface of the PCB substrate to a first end of the pillar that extends to the first surface of the PCB substrate.

12. The method of claim 11, wherein forming the contact comprises plating or screen printing or ink jet printing an electrically conductive material on the first surface of the PCB substrate in electrical contact with the electrical trace and the first end of the pillar.

13. The method of claim 11, wherein a diameter of the pillar is less than or equal to a width of the electrical trace.

14. The method of claim 1, wherein a diameter of the pillar is less than or equal to about 100 microns, less than or equal to about 50 microns, or less than or equal to about 25 microns.

15. The method of claim 1, wherein the micro via extends between opposing surfaces of the PCB substrate and has a diameter less than or equal to about 100 microns.

16. The method of claim 1, wherein the diameter of the micro via is less than or equal to about 50 microns.

17. The method of claim 1, wherein the diameter of the micro via is less than or equal to about 25 microns.

18. The method of claim 1, wherein the micro via comprises the pillar that is electrically conductive and that is positioned within the through hole formed in the PCB substrate.

19. The method of claim 1, wherein the pillar comprises a metallized optical fiber, an electrically conductive micro rod, a metallized carbon micro rod, or an electrically conductive wire.

20. The method of claim 1, wherein the epoxy backfill surrounds the pillar within the through hole.

21. The method of claim 1, wherein the epoxy backfill comprises a high frequency dielectric with a low dissipation factor.

22. The method of claim 1, wherein the pillar positioned in the through hole with the epoxy backfill forms a micro via configured to operate at a frequency of at least 15 gigahertz.

23. The method of claim 1, further comprising:
   forming a contact electrically coupled to the pillar; and
   subsequent to the positioning of the pillar, trimming the pillar directly above the through hole, to a height slightly above or below a height of the contact.

* * * * *